(12) United States Patent
Sonnekalb

(10) Patent No.: US 7,937,639 B2
(45) Date of Patent: May 3, 2011

(54) DEVICE AND METHOD FOR READING OUT A DATA WORD AND DEVICE AND METHOD FOR STORING A DATA BLOCK

(75) Inventor: Steffen Sonnekalb, Taufkirchen (DE)

(73) Assignee: Infineon Technologies AG (DE)

( * ) Notice: Subject to any disclaimer, the term of this patent is extended or adjusted under 35 U.S.C. 154(b) by 1135 days.

(21) Appl. No.: 11/625,974

(22) Filed: Jan. 23, 2007

(65) Prior Publication Data

US 2007/0174753 A1 Jul. 26, 2007

(30) Foreign Application Priority Data

Jan. 23, 2006 (DE) .......................... 10 2006 003 146

(51) Int. Cl.
*H03M 13/00* (2006.01)
(52) U.S. Cl. .................... 714/752; 714/755; 714/758
(58) Field of Classification Search .............. 714/755, 714/758, 770, 800, 752, 746, 769
See application file for complete search history.

(56) References Cited

U.S. PATENT DOCUMENTS

| 5,325,488 A * | 6/1994 | Carteau et al. .......... 710/1 |
| 5,761,168 A * | 6/1998 | Kwon ............. 369/53.22 |
| 6,977,787 B2 * | 12/2005 | Ito ........................ 360/53 |
| 6,986,095 B2 * | 1/2006 | Maeda et al. ............ 714/769 |
| 2004/0117688 A1 | 6/2004 | Vainsensher et al. |

OTHER PUBLICATIONS

Book "Halbleiterschaltungstechnik" from U. Tietze and Ch. Schenk, Springer-Verlag, Berlin 1990, 9th Edition.
Book "Halbleiterschaltungstechnik" regarding Hamming Code, from U. Tietze and Ch. Schenk, Springer-Verlag, Berlin 1990, 9th Edition.

* cited by examiner

*Primary Examiner* — Fritz Alphonse
(74) *Attorney, Agent, or Firm* — Dickstein Shapiro LLP

(57) ABSTRACT

A device for reading out a predetermined data word from a memory in which a data block is divided into a plurality of data words including the predetermined data word, an error identification value associated with the respective data word per data word of the plurality of data words, and a correction value associated with the data block are stored, having an error identifier implemented to check whether the predetermined data word comprises a predetermined relation to the associated error identification value to conclude that there is an error if the predetermined relation is not present, and an error corrector implemented to correct, if the predetermined data word does not have the predetermined relation to the associated error identification value, the error using the correction value, wherein the error corrector is implemented to use the correction value independent of which data word of the plurality of data words is the predetermined data word.

16 Claims, 7 Drawing Sheets

DEVICE AND METHOD FOR READING OUT A DATA WORD AND DEVICE AND METHOD FOR STORING A DATA BLOCK

CROSS-REFERENCE TO RELATED APPLICATION

This application claims priority from German Patent Application No. 10 2006 003 146.6, which was filed on Jan. 23, 2006, and is incorporated herein by reference in its entirety.

BACKGROUND OF THE INVENTION

1. Field of the Invention:

The present invention relates to a device and a method for reading out a predetermined data word from a memory and to a device and a method for storing a data block in a memory, in particular a memory where one-bit errors may sporadically occur, such as, for example, flash memories.

2. Description of the Related Art:

Many of today's memory technologies have the problem that individual bit errors may sporadically occur. This is unavoidable. However, the problem is generally limited to individual widely scattered bits. Multi-bit errors in a limited data region do occur, however they occur so sparsely that they generally do not pose a reliability problem. However, the reliability of many memory products suffers from the individual errors or one-bit errors. For this reason, data stored in memory elements are provided with redundancy information allowing these errors to be recognized and, if applicable, even corrected. A plurality of memory technologies are affected by this, among which, exemplarily, are special flash memory technologies and other non-volatile memory (NVM) types, but also different memory types.

Especially in the field of non-volatile memory types, in particular in flash memory products and flash memory technologies, individual bit errors may occur due to the internal connection of these memories, exemplarily due to a mechanism known as "drain disturb", in repeated writing memory accesses. Apart from flash memories, this problem also occurs in other memory types. RAM (random access memory) memories used, for example, as operating memories are an example of this. There are sporadic one-bit errors in the field of RAM memories due to a particles which may, for example, originate from the potting mass of such a memory element.

Up to now, this problem has been solved by adding an error code per memory block, the memory being organized into individual memory blocks and every memory block including one or several data words. Both error detecting codes (EDCs and error correcting codes (ECCS) are employed here as error codes. For checking the correctness of a datum stored in a memory block, in this case, however, at first the entire memory block has to be read out to be able to check the datum or code for errors using the error code associated with the memory block. However, this procedure has some disadvantages.

If a very small memory block is chosen as a basic unit, the code expenditure, i.e. in particular the memory space, required for storing the error correction value, is very large compared to the size of a memory block. As is exemplarily explained in the book "Halbleiterschaltungstechnik" by U. Tietze and Ch. Schenk (Springer-Verlag, Berlin 1990, 9$^{th}$ Edition), the minimum number of bits of an error correction value allowing any one-bit error to be corrected is 3 bits for a datum having a length between one and 4 bits, is 4 bits for a datum having a length between 5 and 11 bits, is 5 bit for a datum having a length between 12 and 26 bits, is 6 bits for a datum having a length between 27 and 57 bits, is 7 bits for a datum having a length between 58 and 120 bits and is 8 bits for a datum having a length between 121 and 247 bits. These numbers make it clear that the memory expenditure for storing an error correction value as an error code for small memory block entails relatively high memory expenditure, i.e. in relation to the memory length required for storing the error code referenced to the size of the underlying datum. However, on the other hand a small memory unit can be accessed quickly and in an energy-efficient manner.

If, however, a greater block unit or size of the underlying memory block is chosen, the additional expenditure for the error code or the error correction value will be tolerable, however, the access will become very slow and energy-intensive or current-devouring due to the requirement of reading the entire block, even if only an individual byte is required.

If, for example, a data block has a net data block size of 16 bytes or 128 bits comprising sub-words or data words each including 4 bytes, the entire 16 bytes will have to be read for accessing an individual byte to be able to check the individual byte for an error. This produces a time lag of at least 3 or 4 clocks for reading the 3 data words not including this individual byte.

A way of compensating the slow access problem in the case of a greater memory block is installing and using a cache memory. However, cache memories cannot always compensate this disadvantage, which is particularly true in the case of a poor hit rate. In the case of a poor hit rate, required data frequently not cached or stored in the cache memory are requested by a processor or another component of the overall system including the memory. In this case, using a cache memory cannot accelerate the data access since in this case the entire memory block of the memory still has to be read for providing the datum desired in order to rule out an error.

SUMMARY OF THE INVENTION

The present invention provides a device and a method for reading out from a memory or a device and a method for storing in a memory, allowing fast reading out and checking for an error, as well as correction thereof, at the same time entailing a relatively low memory expenditure.

In accordance with a first aspect, the present invention provides a device for reading out a predetermined data word from a memory in which a data block is divided into a plurality of data words including the predetermined data word, an error identification value associated with the respective data word per data word of the plurality of data words, and a correction value associated with the data block are stored including error identification means implemented to check whether the predetermined data word has a predetermined relation to the associated error identification value to conclude that there is an error if the predetermined relation is not present, and error correction means implemented to correct the error using the correction value if the predetermined data word does not have the predetermined relation to the associated error identification value, the error correction means being implemented to use the correction value for error correction independent of which data word of the plurality of data words is the predetermined data word.

In accordance with a second aspect, the present invention provides a device for storing a data block from a plurality of data words into a memory including error identification value generating means implemented to generate, for each data word of the plurality of data words, an error identification value having a predetermined relation to the respective data word, and error correction value generating means implemented to generate, for the data block, a correction value from which an error resulting in the non-presence of the predetermined relation between the predetermined data word and the associated error identification value is correctable independent of which of the data words corresponds to the predetermined data word.

In accordance with a third aspect, the present invention provides method for reading out a predetermined data word from a memory in which a data block is divided into a plurality of data words including the predetermined data word, an error identification value associated with the respective data word per data word of the plurality of data words, and a correction value associated with the data block are stored, having: checking whether the predetermined data word has a predetermined relation to the associated error identification value to conclude that there is an error if the predetermined relation is not present; and correcting the error using the correction value if the predetermined data word does not have the predetermined relation to the associated error identification value, wherein, in the step of correcting, the correction value is used for error correction independent of which data word of the plurality of data words is the predetermined data word.

In accordance with a fourth aspect, the present invention provides a method for storing a data block from a plurality of data words in a memory, having: generating an error identification value for every data word of the plurality of data words, having a predetermined relation to the respective data word; and generating a correction value from which an error resulting in the predetermined relation between a predetermined data word and the associated error identification value not to be present is correctable independent of which of the data words of the plurality of data words corresponds to the predetermined data word.

In accordance with a fifth aspect, the present invention provides a device for reading out a predetermined data word from a memory in which a data block is divided into a plurality of data words including the predetermined data word, an error identification value associated with the respective data word, which, however, does not allow a correction of the respective data word, per data word of the plurality of data words, and a correction value associated with the data block are stored, having: error identification means implemented to check whether the predetermined data word has a predetermined relation to the associated error identification value to conclude that there is an error if the predetermined relation is not present; and error correction means implemented to correct, if the predetermined data word does not have the predetermined relation to the associated error identification value, the error using the correction value, wherein the error correction means is implemented to use the correction value for error correction independent of which data word of the plurality of data words is the predetermined data word.

In accordance with a sixth aspect, the present invention provides a device for storing a data block from a plurality of data words in a memory, having: error identification value generating means implemented to generate, for each data word of the plurality of data words, an error identification value having a predetermined relation to the respective data word, which, however, does not allow the respective data word to be corrected; and error correction value generating means implemented to generate, for the data block, a correction value from which an error resulting in the predetermined relation between a predetermined data word and the associ- ated error identification value not to be present is correctable independent of which of the data words corresponds to the predetermined data word.

In accordance with a seventh aspect, the present invention provides a method for reading out a predetermined data word from a memory in which a data block is divided into a plurality of data words including the predetermined data word, an error identification value associated with the respective data word, which, however, does not allow the respective data word to be corrected, per data word of the plurality of data words, and a correction value associated with the data block are stored, having: checking whether the predetermined data word has a predetermined relation to the associated error identification value to conclude that there is an error if the predetermined relation is not present; and correcting the error using the correction value if the predetermined data word does not have the predetermined relation to the associated error identification value, wherein in the step of correcting the correction value is used for error correction independent of which data word of the plurality of data words is the predetermined data word.

In accordance with an eighth aspect, the present invention provides a method for storing a data block from a plurality of data words in a memory, having: generating an error identification value for each data word of the plurality of data words having a predetermined relation to the respective data word, which, however, does not allow a correction of the respective data word; and generating a correction value from which an error resulting in the predetermined relation between a predetermined data word and the associated error identification value not to be present is correctable independent of which of the data words of the plurality of data words corresponds to the predetermined data word.

In accordance with a ninth aspect, the present invention provides a computer program having a program code for performing one of the above mentioned methods, when the computer program runs on a computer.

BRIEF DESCRIPTION OF THE DRAWINGS

Preferred embodiments of the present invention will be detailed subsequently referring to the appended drawings, in which.

DESCRIPTION OF PREFERRED EMBODIMENTS

Figure 1:
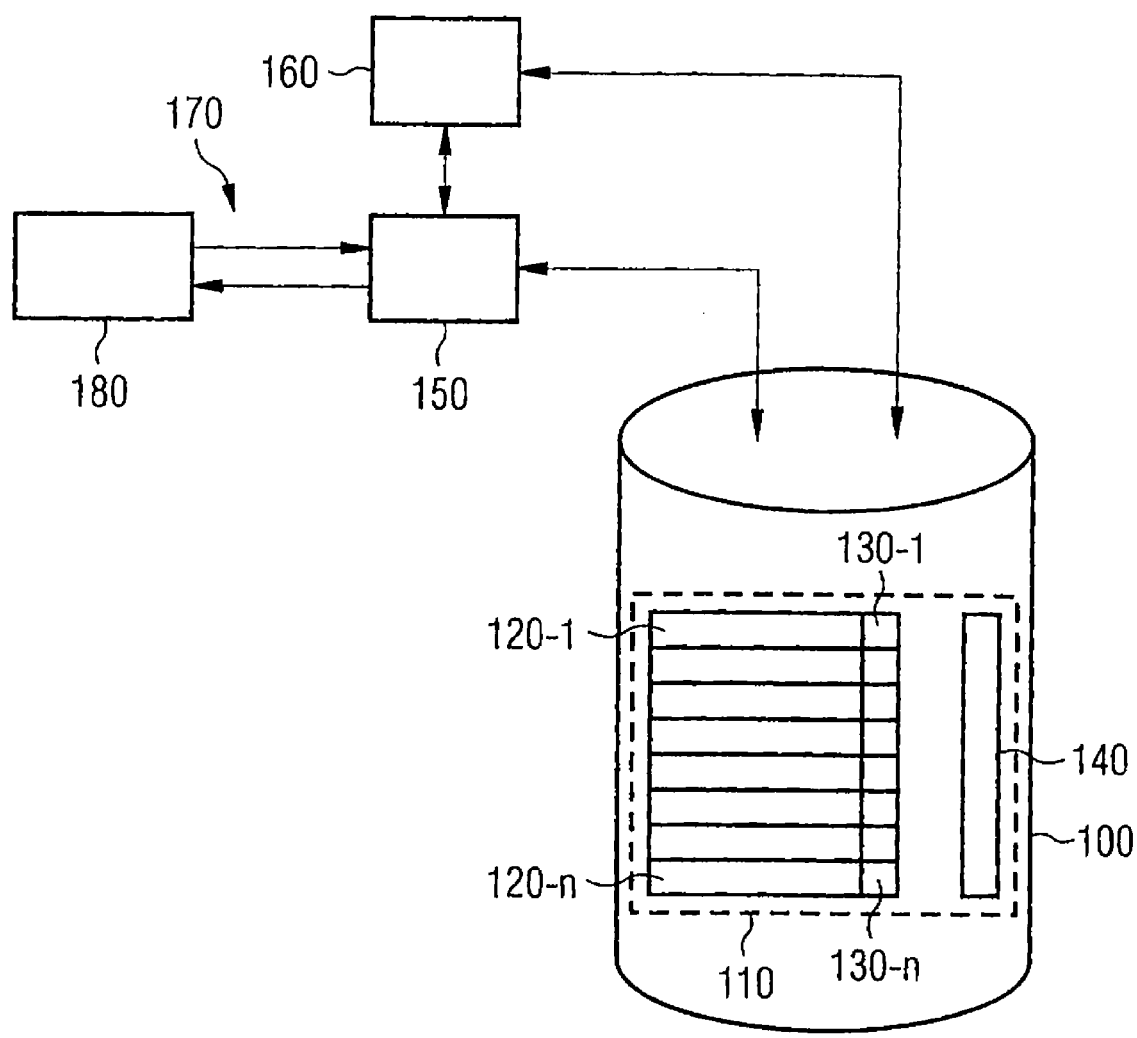
FIG. 1 is a schematic block circuit diagram of an inventive device for reading out a predetermined data word from a memory.

The present invention is based on the finding that fast readout of a data word from a memory and check thereof for an error, including the possibility of correcting such an error based on a correction value only requiring a relatively small memory space can be achieved by associating an error identification value to each data word and associating, to a data block including a plurality of data words, a correction value allowing an error to be corrected independent of which data word of the plurality of data words in the data block has the error.

It is of particular advantage here that a fast check for the presence of an error is possible due to the error identification value associated with each data word, while the correction value required for a correction refers to an entire data block and thus has smaller memory space requirements than would be the case for a correction value referring to an individual data word. The reason for this is that a data block includes a plurality of data words and that the memory requirements of the correction value related to the length of the data block decrease with an increasing data block length.

Additionally, it is of particular advantage for the error identification values associated with the data words to each have a length of precisely one bit, i.e. to require the smallest possible additional memory expenditure. In addition, using parity bits as error identification values, i.e. checking the parity of the individual data words due to the respective parity bit associated, allows a very fast check for an error since a parity check is possible in parallel in a clock cycle of the system including the memory.

Another advantage is that the correction value may be used to correct any one-bit error in the data block on the one hand or any one-bit error in the data word or in a data word and the associated error identification value on the other hand, as detailed embodiments will show. Depending on the boundary conditions to the system including the memory, it may be of greater advantage to implement the correction value such that any one-bit error in the data block or else in a data word and/or in a data word and the association error identification value is correctable.

Another advantage of the present invention is that the length required for storing the correction value can be reduced by the fact that, on the basis of each data word the data block includes, a sub-correction value is calculated, from which in turn the correction value is generated by applying a linking or operation, such as, for example, a bit-wise XOR (exclusive-or) operation. If there is an error when reading out, on the basis of the correction value and the sub-correction values calculated from the data words which are not the data word to be read out, a reconstructed sub-correction value is determined for the data word to be read out on the basis of which its correction is performed. This is of particular advantage in that the length of the correction value is no longer related to the length of the data block but rather corresponds to the length of a correction value relating only to one data word. The memory requirements for the correction values can be reduced again by this without impeding the possibility of a fast readout of a predetermined data word.

Thus, the invention at the same time allows a fast readout of a data word and a check for an error, at the same time requiring relatively little memory space for the correction value necessary for the correction.

An embodiment of an inventive device for reading out a predetermined data word from a memory will be described referring to FIGS. 1 to 7. Similar reference numerals will be used for similar objects and method steps in FIGS. 1 to 7. In addition, same objects and method steps will be referred to by the same reference numerals.

FIG. 1 shows a schematic block circuit diagram of an embodiment of an inventive device for reading out a predetermined data word from a memory 100. A data block 110 including a plurality of data words 120-1, ..., 120-n and a plurality of error identification values 130-1, ..., 130-n associated with each one of the data words 120-1, ..., 120-n and a correction value 140 is stored in the memory 100. Put differently, the data block 110 is divided into n sub-words or data words 120-1, ..., 120-n. The memory 100 is coupled to error identification means 150 and error correction means 160. In addition, the error identification means 150 is coupled to the error correction means 160. The error identification means 150 is also connected to an external component 180 which may, for example, be a CPU (central processing unit), a memory, a special processor, a crypto-processor or other means via, for example, a bi-directional bus 170. The error identification means 150 and the error correction means 160 are frequently formed as a part of a memory control unit which, however, is not shown in FIG. 1.

In embodiments of the present invention, the error identification means 150 and the error identification value generating means are implemented such that the error identification values 130-1, ..., 130-n allow a check for the presence of an error in the data words 130-1, ..., 130-n associated thereto, but not a correction of the respective data words should this be discovered in the error identification. In embodiments of the present invention, the error identification values 130-1, ..., 130-n thus represent values which do allow finding or identifying an error in a data word, but not correcting it.

It must be kept in mind here that, depending on the algorithm used, a multi-bit error of the data word may also be referred to as an error in this discussion. Depending on the specific design of the respective embodiments, an error identification value may include exactly one bit or also have a length of more than one bit. Examples of error identification methods which do not allow an error correction and the error identification values of which have a length of precisely one bit are, for example, a parity check using parity bits or generating (redundant) check sums which may be reduced to precisely one bit by clipping, selecting or by another form of reducing the number of bits.

Methods having an error identification value of a length of more than one bit not allowing correction either are, for example, calculating redundant check sums, like in the form of a CRC (cycling redundancy check sum) error protection method, generating (cryptographically secure) hash values via hash functions and/or one-way hash functions.

In further embodiments of the present invention, error identification values may, on the basis of a parity bit having a length of more than one bit, for example also be generated by repeating the parity bit and/or attaching its complementary value to the parity bit. The case of the parity bit as the error identification value will be described in particular in the description below, even if this is not to be construed as a limitation, as has been mentioned before.

As has been explained in the introductory section of the present application, multi-bit errors may in principle occur in a data area, but so rarely that they do not generally impede the reliability of memories 100. Since one-bit errors represent a greater reliability problem, it will in the further course of the application be assumed or taken as a precondition that a data block 110 may comprise a one-bit error, but not a multi-bit error, except where this is explicitly expressed in the present application. The error identification values 130-1, ..., 130-n thus guarantee the possibility of identifying one-bit errors for the n data words or sub-words 120-1, ..., 120-n into which the data block 110 to be protected from individual bit errors is divided and/or for each data word 120-1, ..., 120-n.

If the external component 180 accesses a certain data word from the memory via the bi-directional bus 170, for example in a read instruction or readout instruction, the error identification means 150 will receive the corresponding data word, such as, for example, the data word 120-2, and the associated error identification value, i.e. the error identification value 130-2, and checks the data word 120-2 for the presence of an error on the basis of the error identification value 130-2. Alternatively, the error identification means 150 can receive, via the bi-directional bus 170 from the external component 180, the instruction to read out a certain data word from the memory 100, i.e. a read instruction or readout instruction. In this case, the error identification means 150 will access the memory 100 and read the respective data word, i.e. in the above example the data word 120-2, and the associated error identification value, i.e. the error identification value 130-2, and check the data word 120-2 for the presence of an error on the basis of the error identification value 130-2.

If the error identification means 150 does not determine an error, independent of whether it has executed the read instruction itself or has only performed the check for the presence of an error, the data word 120-2 or only a part thereof will be output to the external component 180 via the bi-directional bus 170.

If the error identification means 150 determines an error in the above example when checking the data word 120-2, this will be a one-bit error due to the preconditions indicated above. In this case, the error identification means 150 will instruct the error correction means 160 to read out the correction value 140 associated with the data block 110 including the data word 120-2 and correct the data block 110 correspondingly on the basis of the correction value 140. After finishing the correction of the data block 110, the error correction means 160 will transmit a signal to the error identification means 150, whereupon the error identification means 150 will again read out the corresponding data word, in the above example the data word 120-2, along with the respective error identification value 130-2, will again check for an error and, in the case of no error in the data word 120-2, output same to the external component 180 via the bi-directional bus 170.

In order to allow the fastest individual bit error identification possible in combination with an error correction saving memory space, a parity bit is frequently used for the error identification values 130-1, ..., 130-n, so that checking for the presence of an error takes place by comparing the parity of one of the data words 120-1, ..., 120-n to the associated parity bit 130-1, ..., 130-n, since checking the parity of a data word 120-1, ..., 120-n can be performed very quickly over all data bits by a parallel operation. Here, it is irrelevant whether an even or an uneven parity is used as the error identification value, i.e. whether the number of the set bits of the data word is even or uneven. Basically, however, every method for identifying an error can be used so that using a parity bit in the following embodiments is not to be seen in a limiting sense. However, using a quick error identification method saving memory space, such as, for example, checking the parity using parity bits 130-1, ..., 130-n associated with the data words 120-1, ..., 120-n, is of advantage here. Checking the parity thus has the advantage that it can be performed quickly and the further advantage that the additionally required memory space for the parity bits 130-1, ..., 130-n is very low, without losing the possibility of identifying any one-bit error.

Due to the fact that precisely one individual parity bit 130-1, ..., 130-n is associated with each of the n data words 120-1, ..., 120-n and that the error correction code or correction value 140 is determined over the entire data block 110, a quick check of an individual data word for an error on the one hand and a comparatively small complexity or memory space requirement for storing the correction value 140 on the other hand are made possible. Put differently, the present invention allows keeping low or minimizing the memory space necessary for storing the error correction value required by separately applying the error identification method to each of the data words 120-1, ..., 120-n, whereas the error correction method is applied to the plurality of data words 120-1, ..., 120-n and/or data block 110. Thus, the length of the correction value 140 can be minimized utilizing the parity bits 130-1, ..., 130-n, while the parity bits 130-1, ..., 130-n allow a quick check of one of the data words 120-1, ..., 120-n for the presence of an error and thus a quasi-immediate provision of the respective data word to the downstream receiver unit and/or the external component 180, as long as there is no error. The error correction is thus realized by introducing a corresponding code 140 over the entire data block 110, i.e. by introducing a correction value 140 relating to the entire data block 110.

Under the precondition mentioned above that there be a maximum of exactly one one-bit error per data block 110, it can be determined immediately when reading the desired sub-data word and/or data word whether the sub-data word or even the data word is correct or not. If it is correct, it can be immediately output to and processed by a downstream unit 180. In this case, the remaining data block no longer has to be read out. Thus, an essential advantage of the present invention results from a considerable improvement in the execution time of a read operation and an accompanying considerable reduction in the energy expenditure when individual words can be resorted to for an access (block access), instead of the entire data block 110.

In the case that there is an error, the error, however, can be corrected using the correction value 140 so that the then correct data word can be provided or output after the correction has taken place. Thus, the present invention allows selecting a large block unit or data block 110 to keep the code expenditure for storing a correction value 140 small, and at the same time allows quick access to a datum or data word and checking it for an error. In the case of a read access to a datum or data word, the entire data block 110 may be read out, however this is not a requirement.

In the further course of the present application, the inventive method for reading out a predetermined data word from a memory 100 will be discussed using four embodiments and the inventive method for storing a data block 110 in a memory 100 will be explained in greater detail using two embodiments and the advantages thereof discussed referring to FIGS. 2 to 7.

Figure 2:
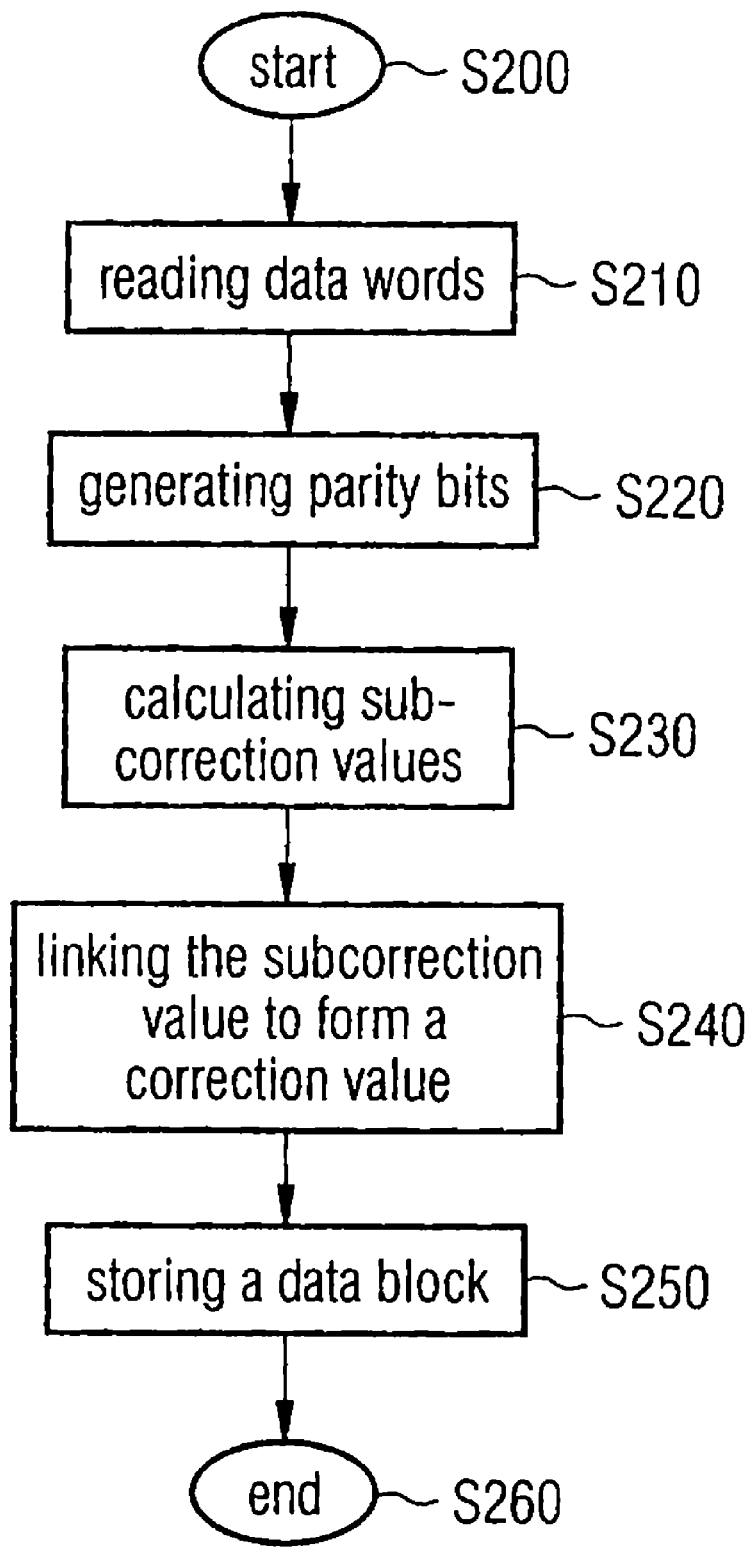
FIG. 2 is a flowchart of a first embodiment of the inventive method for storing a data block in a memory.

FIG. 2 is a flowchart of a first embodiment of the inventive method for storing a data block 110 in a memory 100. After starting S200 the method, the n data words 120-1, ..., 120-n are at first read (step S210). In a next step S220, the parity bits 130-1, ..., 130-n associated with the data words 120-1, ..., 120-n are generated. n sub-correction values or sub-error codes are calculated over the individual data words 120-1, ..., 120-n in a subsequent step S230. Subsequently, the n sub-correction values are subjected to a bit-wise XOR operation or summed up via a bit-wise XOR (exclusive-or) structure in a next step S240, wherein the result of this operation or summation is associated with the data block 110 as a sum code or correction value 140. In a next step S250, the data block 110, i.e. the individual data words 120-1, ..., 120-n, the parity bits 130-1, ..., 130-n and the correction value 140, are stored in the memory 100, which is the end of this write process (step S260).

Due to the fact that individual error correction codes are calculated n times, each independent of one another, over the individual data words 120-1, ..., 120-n, these n sub-error codes are subsequently summed up bit by bit via an XOR structure and the resulting sum code is stored as a correction value 140 with the data block 110, some bits in length as difference bits can be saved compared to a correction value 140 referring to the entire data block 110. Exemplarily starting from a net data block size of 16 bytes, i.e. 128 bits, which are given due to the width of the bus system or the bi-directional bus 170 or other boundary conditions in sub-words or data words of 4 bytes each, i.e. 32 bits, it follows that the data block 110 includes 4 data words 120-1, ..., 120-n, i.e. n=4. As has already been mentioned in the introductory section of the present application, the result, originally referring to the entire data block 110, in this case is an error code of a length of 8 bits for a pure error correction algorithm or 9 bits for a combination of error correction and error identification algorithms, wherein the error identification algorithm is implemented in the form of a parity comparison with a parity bit for the data block 110. As has also already been discussed in the introductory section of the present application, without the inventive method described below, the complete 16 bytes always have to be read for an access to an individual byte, which results in a time lag of at least 3 or 4 clocks. The inventive method allows performing a well-aimed byte access in an individual clock in which the addressed word having a length of 4 bytes is read directly. The code overhang or the entire code width, i.e. the additional memory requirement for performing the inventive method in this case is 10 bits resulting from the 4 parity bits 130-1, ..., 130-n associated with the data words 120-1, ..., 120-n and a 6-bit error correction code or sub-correction value for a data packet including 33 bits. Apart from the 32 data bits of the data word including 4 bytes, the data packet additionally comprises the parity bit associated with the data word. Since, due to the bit-wise XOR lining of the sub-correction values to the correction value 140 associated with the data block 110, its length remains unchanged, the result is an overall code width or length for the correction value 140 and the parity bits 130-1, ..., 130-n of 10 bits altogether. Compared to a possible solution, as has been discussed in the introductory section of the present application, the additional code overhang, i.e. the addition memory space requirement, is only a length or 1 or 2 bits, which, due to the higher readout speed in the inventive method for reading out a predetermined data word, which will be explained below in greater detail, is a disadvantage negligible compared to the speed improvement achievable.

Figure 3:
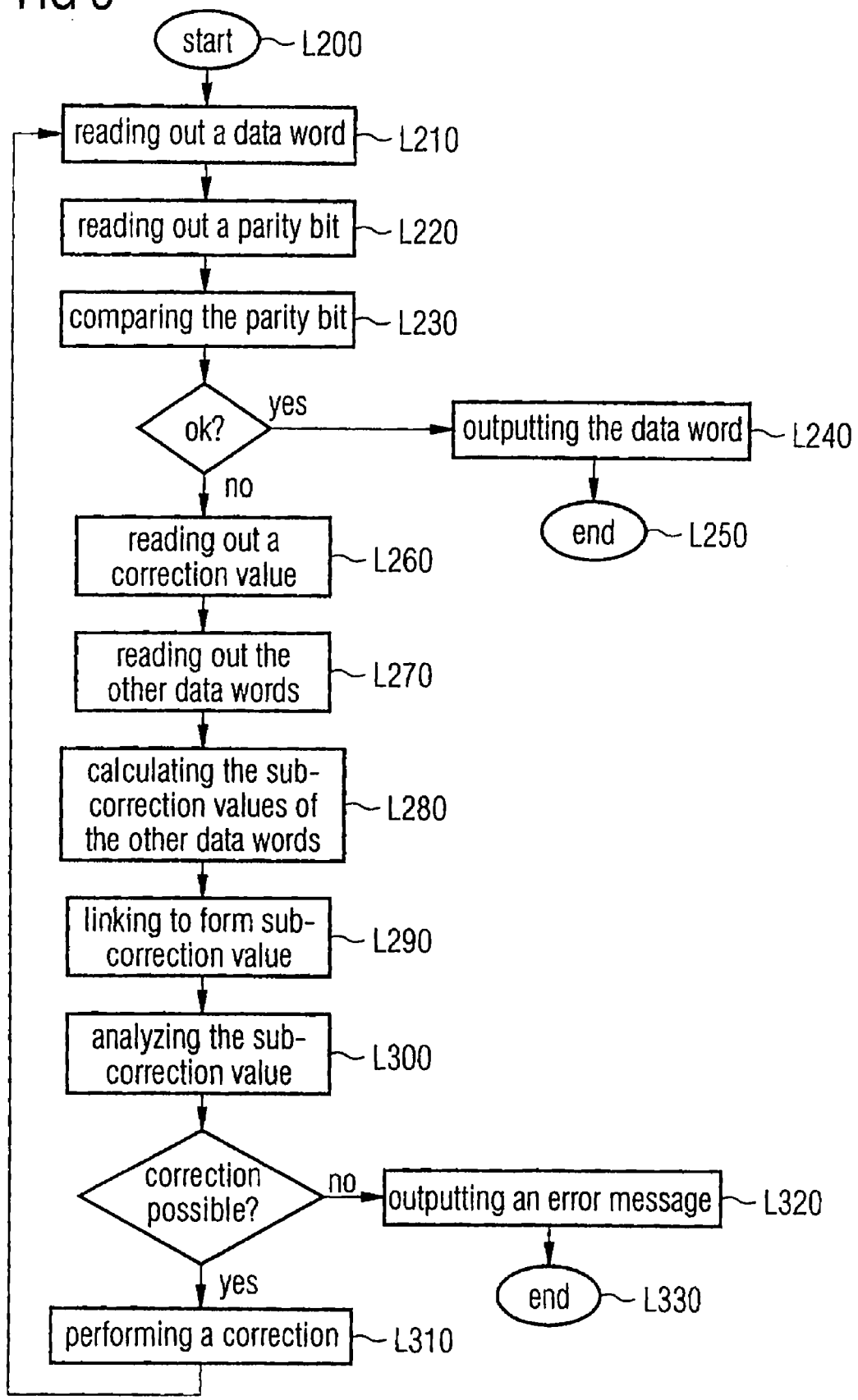
FIG. 3 is a flowchart of a first embodiment of the inventive method for reading out a predetermined data word from a memory.

FIG. 3 is a flowchart of a first embodiment of the inventive method for reading out a predetermined data word from a memory 100 which supplements the embodiment of a write process shown in FIG. 2. After a start L200, the predetermined data word is at first read out from the memory 100 on the basis of its address in a first step L210. In a second step L220, the associated parity bit is also read out and in a third step L230 the parity of the predetermined data word is compared to the value of the associated parity bit. If the two match, in a step L240 the predetermined data word will be output via the bi-directional bus 170 and the read process ends in a step L250.

If the two values, i.e. the parity of the data word read out and the value of the associated parity bit, do not match, which indicates a one-bit error, in a step L260 the correction value 140 of the data block 110 will at first be read out. In addition, the other data words are also read out in a next step L270. In a following step L280, the respective sub-correction values are calculated on the basis of the other data words and linked, together with the correction value 140, to form the sub-correction value of the predetermined data word in a step L290. In a step L300, the sub-correction value achieved in this way is analyzed and evaluated. If the result of this analysis is that a correction of the data word is possible, this correction will be performed in a step L310 and the process continued with step L210. If the result of the analysis of the sub-correction value, however, is that a correction is not possible, an error message will be output to the external component 180, for example via the error identification means 150 and via the bi-directional bus 170 in a step L320 and the read process ends in a step L330 with an error.

The linking of the sub-correction values of the other data words and the correction value 140 associated with the data block 110 performed in sub-step L290 again is, as has already been the case in the embodiment shown in FIG. 2, a bit-wise XOR linking or operation. Due to the characteristics of the bit-wise XOR linking and in connection with the embodiment for storing the data block 110 in the memory 100 described in FIG. 2, the result of this linking is the very error code or sub-correction value of the predetermined data word affected by the parity error.

The present invention may also be utilized in connection with a cache memory if such a usage is desired or necessary, for example to allow a datum to be provided even more quickly. Even if such a cache memory has a poor cache hit rate, i.e. for example when a program running on a processor requests a plurality of different data from the memory which are not cached in the cache memory, the present invention can compensate this completely or at least partly.

In the case that a cache memory is used, a so-called "wrapping burst fill" process can be applied in connection with the cache memory. This means that at first the actual data word required from the memory is stored in the cache memory, wherein the integrity or correctness of the respective data word can be checked using the error identification value associated with the data word, directly when storing same in the cache memory. Thus, the error identification value allows instantaneous provision of the data word to an external component or a downstream receiver unit 180, such as, for example, a CPU (central processing unit), another memory, an input/output unit, a special processor, a crypto-processor or another unit. While the data word required has already been made available to the downstream receiver unit 180, the remaining missing data words 120-1, ..., 120-n of the data block 110 can be stored in the cache memory which typically has a setup organized in blocks. Thus, the inventive methods also allow considerable improvement in the execution speeds and a considerable reduction in the energy expenditure, which is of particular advantage for mobile applications, such as, for example, mobile phones, PDAs (personal data assistants) and other portable devices.

Put differently, should one of the data words 120-1, ..., 120-n of the overall block or the data block 110 have a parity bit, the following correction algorithm will be applied: The respective sub-error correction codes of the data words not affected by the parity error will be calculated. Then, the XOR sum over those will be calculated and the result will be summed up with the stored sum error correction code or correction value 140 via an XOR operation. The result will be the error correction code of the data word affected by the parity error, by means of which the individual bit error can then be corrected.

The embodiments of the inventive methods shown in FIGS. 2 and 3 are based on the fact that the error correction codes are not calculated over the entire data block 110, but, independent of one another, each over the individual data words

120-1, . . . , 120-n. The sub-error codes or sub-correction values obtained in this way are then linked to one another and stored as the correction value 140 together with the data block 110. Since the error correction code for a sub-data word or data word frequently has a smaller bit width than a correction value 140 over the entire data block, under the precondition of a suitable linking, such as, for example, the bit-wise XOR (exclusive-or) operation, the memory space required for storing the correction value 140 can still be reduced. Should an error arise requiring a correction of a data word, the sub-correction values of the data words 120-1, . . . , 120-n not affected by the error must be calculated and linked with the stored correction value 140 to obtain the sub-correction value for the requested data word. Using this, the individual bit error in the data word requested can be corrected.

In the embodiments of the inventive method for reading out and storing described in FIGS. 2 and 3, a correction of a one-bit error which may occur in the region of the parity bits 130-1, . . . , 130-n may also be performed apart from a correction of the actual data words 120-1, . . . , 120-n. This possibility of also correcting errors in the area of the parity bits and/or the error identification values 130-1, . . . , 130-n, however, need not necessarily be implemented. Thus, in principle it is also conceivable that the additional protection against an error in the region of the parity bits 130-1, . . . , 130-n may also increase the length of the correction value 140 disadvantageously by one bit, for example when a data word should only have a length of 4 bits. In this case, an error correction value having a length of 3 bits would be necessary for a protection against a one-bit error. If, however, additionally the associated parity bit is also protected against errors, the length of the bits to be protected is 5, which would require an additional error correction bit. The methods described in FIGS. 2 and 3 are of particular advantage when only little memory space is available, as is the case in special chips, chip cards, integrated circuits or other small applications optimized as to memory space.

Figure 4:
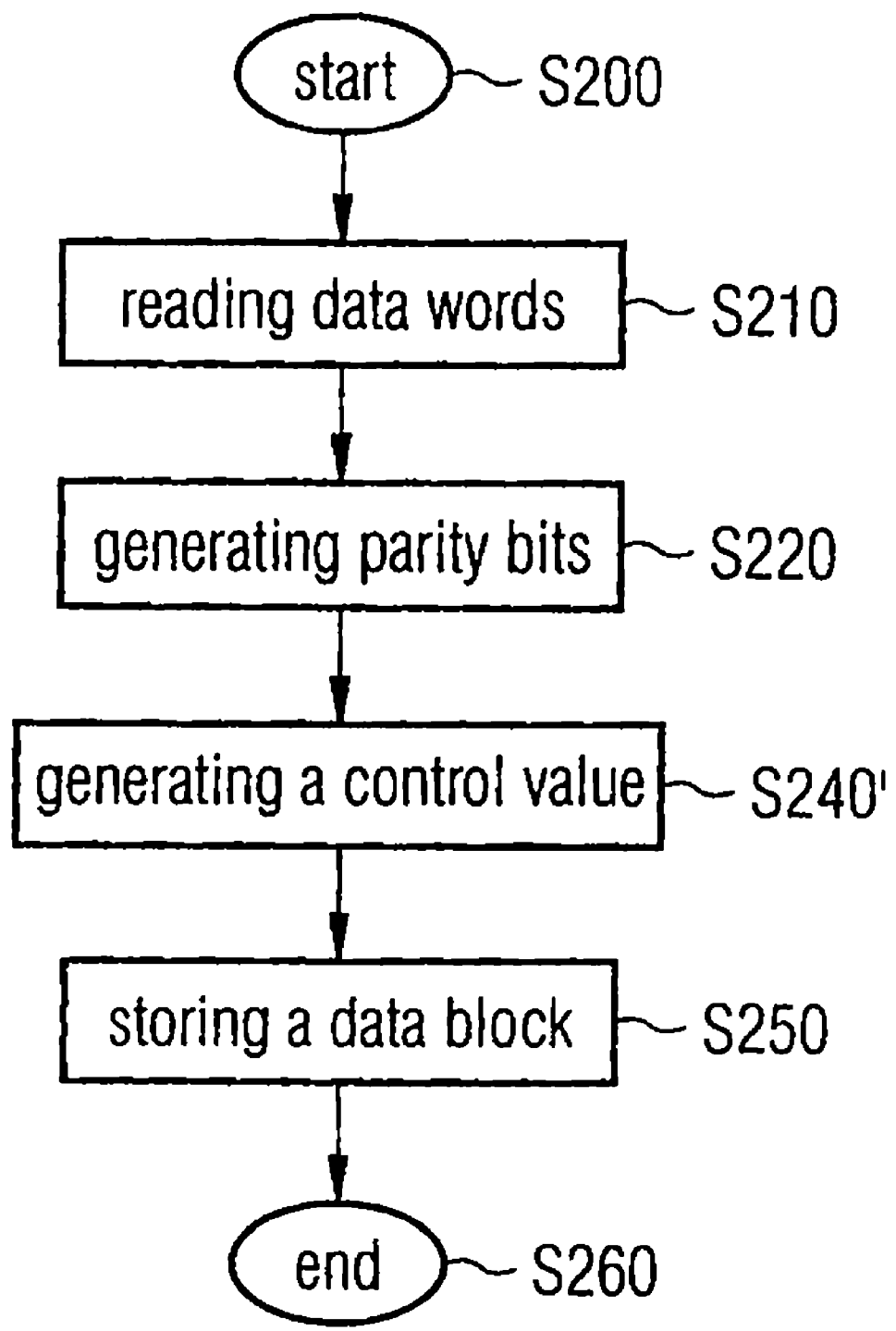
FIG. 4 is a flowchart of a second embodiment of the inventive method for storing a data block to a memory.

FIG. 4 is a flowchart of a second embodiment of the inventive method for storing a data block 110 in the memory 100. This embodiment, compared to the first embodiment shown in FIG. 2, is a slightly varied version where the correction value 140 and/or a sub-correction value derived therefrom cannot be used only for correcting an individual data word of the plurality of data words 120-1, . . . , 120-n, but refers to the complete data block 110. The embodiment shown in FIG. 4 basically differs from the embodiment shown in FIG. 2 only in two points relating to the generation of the control value 140. Both embodiments are parallel up to step S220 in which the parity bits 130-1, . . . , 130-n are generated. In contrast to the embodiment shown in FIG. 2, however, step S230 in which the sub-correction values were calculated in FIG. 3 is not performed. Instead, the control value 140 is generated on the basis of the entire data block 110 in a modified step S240' substituting step S240 in the embodiment shown in FIG. 2. This embodiment of the inventive method for storing a data block 110 is also finished by two steps S250 where the data block 110 is stored and step S260.

Figure 5:
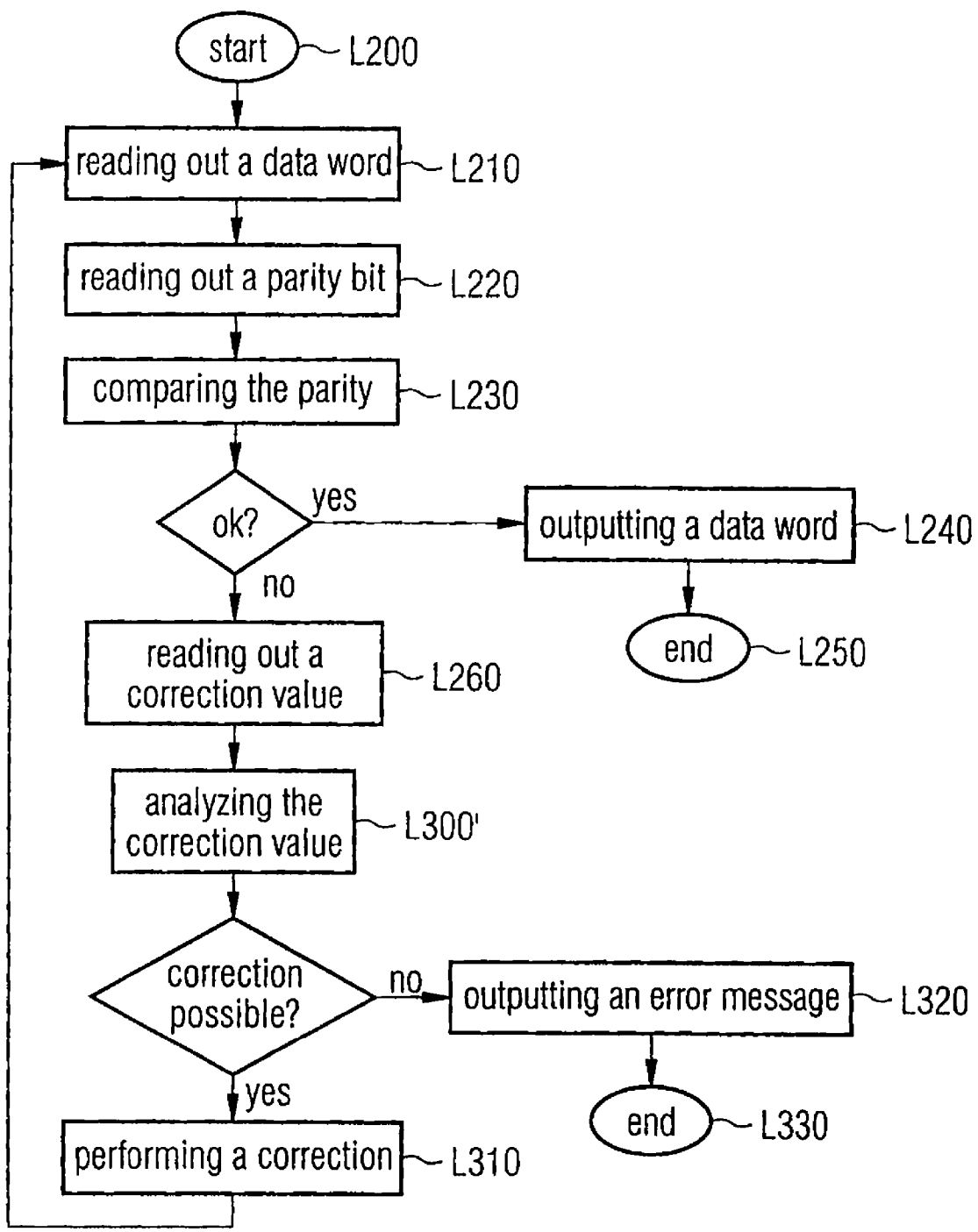
FIG. 5 is a flowchart of a second embodiment of the inventive method for reading out a predetermined data word from a memory.

The embodiment for reading out a predetermined data word belonging to the embodiment of the inventive method for storing a data block 110 shown in FIG. 4 is illustrated in FIG. 5 in the form of a flowchart and also differs only slightly from the embodiment for reading out a predetermined data word which is shown in FIG. 3. Here, too, the differences basically only affect the preparing steps resulting in performing the actual correction in the case of an error (step L310). The embodiment shown in FIG. 5 does not differ from the embodiment shown in FIG. 3 up to and including the step of reading out the correction value 140 in step L260. However, in contrast to the embodiment shown in FIG. 3, steps L270, L280 and L290 are not performed. Step L300 of the embodiment shown in FIG. 3 is substituted by a modified step L300' in which the correction value 140 read out in step L260 is analyzed to evaluate whether a correction is possible in principle in the case of an error occurring. If such a correction is not possible, the inventive method will be continued in analogy to the procedure of the embodiment shown in FIG. 3 with step L320, i.e. outputting an error message. If a correction is possible, it will be performed in step L310 in analogy to the embodiment shown in FIG. 3 and the readout operation will subsequently be continued with step L210, i.e. in analogy to the embodiment shown in FIG. 3.

The embodiments of the inventive method for storing a data block and for reading out a predetermined data word from a memory 100 shown in FIGS. 4 and 5 basically only differ from the two embodiments shown in FIGS. 2 and 3 in that they can do without the sub-error code summing using an XOR linking described. Assuming the example already indicated above of a net data block size of 16 bytes which are exemplarily divided due to the bus system into n=4 sub-words or data words 120-1, . . . , 120-n each having 4 bytes, the result, due to the net data block size of 128 bits, will be an error correction code or correction value 140 having a width of at least 8 bits. Thus, the overall code for the error identification and the error correction would be a memory complexity of 12 bits, including the 4 parity bits 130-1, . . . , 130-n of the 4 data words 120-1, . . . , 120-n. Compared to a possible solution indicated in the introductory section of the present invention of an originally planned error code length of 8 bits or 9 bits, this solution, however, is only competitive to a limited extent. Nevertheless, these embodiments of the inventive methods for storing a data block and/or for reading out a predetermined data word may also comprise enormous advantages despite seeming disadvantageous at first sight. If, for example, some steps of the embodiment shown in FIG. 3 cannot take place quickly, i.e. in one or a few clock cycles, due to constructive limits, security requirements or different reasons, it may, depending on the boundary conditions, be of advantage to omit the additional calculating, reading-out and linking steps in favor of a higher memory space requirement, since the correction time may be shortened by this. Compared to a solution also described in the introductory section of the present invention, the advantage of a quick readout and a quick check for the presence of an error will also remain in the embodiment shown in FIG. 5, so that a quicker readout of a predetermined data word will be possible at least in the case of no error occurring.

Another possibility of using the inventive method for reading out a predetermined data word is in the field of security applications having larger protection code words and/or extended correction values 140. The parity bits or error identification values 130-1, . . . , 130-n are used to rule out and/or detect one-bit errors. In a security check, however, nevertheless all the data words 120-1, . . . , 120-n will be read out to be able to finally check the error code or correction value 140. This procedure still allows quick provision of the actually desired data word and, on the other hand, allows checking the memory for an attack. In the case of a multi-bit error, for example, which may in general no longer be detectable using a parity bit and which is usually considered to be an attack by security elements, the memory control unit may initiate an interruption of the action in process, such as, for example, in the form of a security reset, exemplarily by the error identification means 150 or the error correction means 160 by outputting an alarm signal. In the further course of the present application, two embodiments of the inventive method for reading out a predetermined data word will be described, as they may be used in the field of security applications. These two embodiments here are modifications of the embodiments of the inventive method for reading out a predetermined data word shown in FIGS. 3 and 5.

Figure 6:
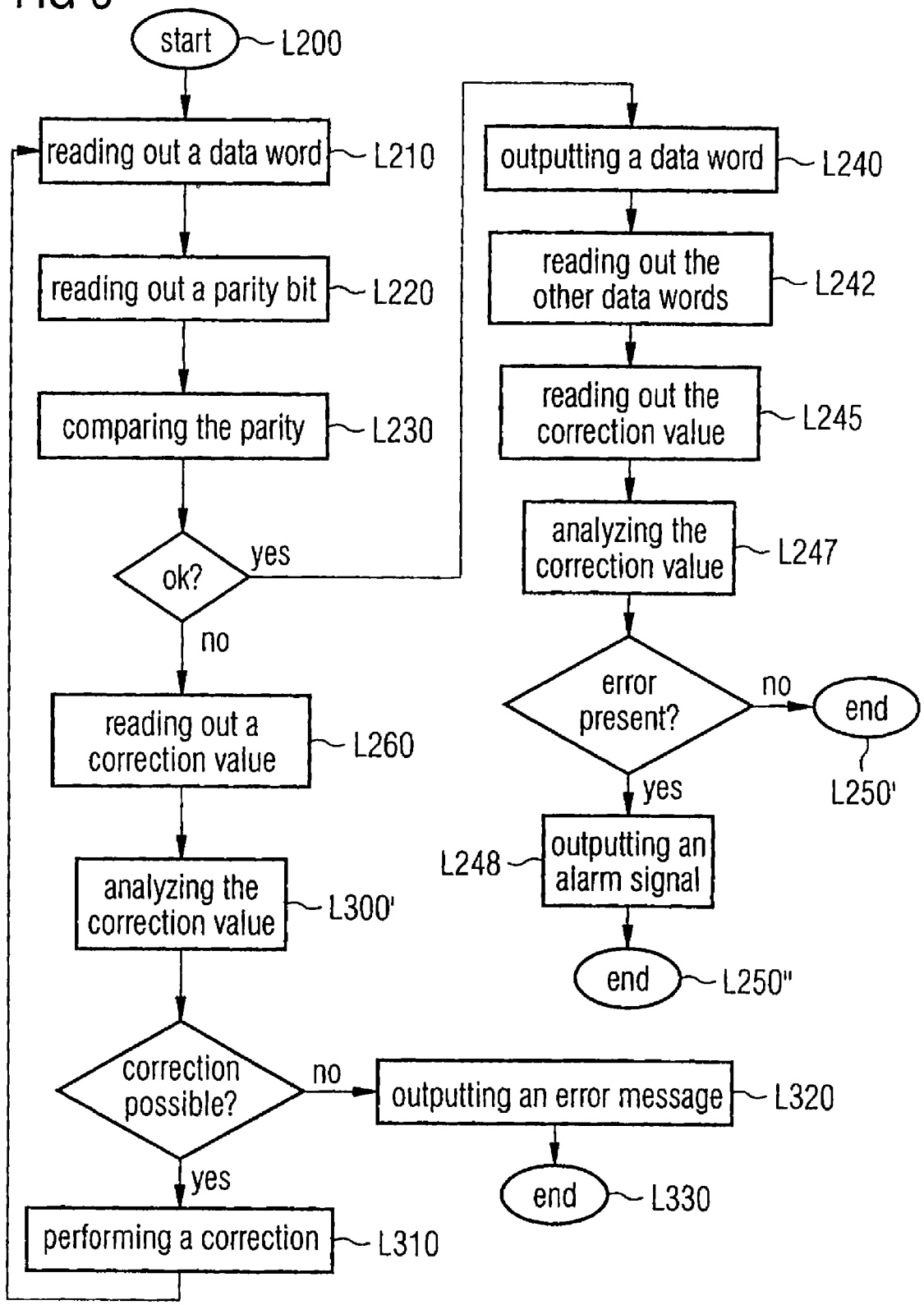
FIG. 6 is a flowchart of a third embodiment of the inventive method for reading out a predetermined data word from a memory.

FIG. 6 shows a third embodiment of the inventive method for reading out a predetermined data word from a memory 100 which is modified for being employed in a security application and is based on the embodiment shown in FIG. 5. This embodiment will only differ from the embodiment shown in FIG. 5 in the case that the comparison of the parity of the data word read out matches the associated value of the parity bit in step L230. In this case, the data word will also be output in the embodiment shown in FIG. 6 in step L240. In a subsequent step L242, the other data words 120-1, . . . , 120-n are read out. In step L245, the correction value 140 is read out and analyzed in step L247. If no error is found in this analysis, the readout method will be finished in step L250'. If, however, an error is determined in step L247, an alarm signal will be output in step L248 and the method will be finished in step L250". In this case, the alarm signal indicates a multi-bit error, since a one-bit error would have had to be determined by the previous check of the parity bits 130-1, . . . , 130-n in step L230. Since, as has already been discussed in the introductory section of the present invention, multi-bit errors hardly occur, they are usually evaluated as being attacks by security elements or security controllers so that as a countermeasure the action in process must be interrupted, exemplarily in the form of a security reset, which can then, for example, be triggered by the alarm signal.

Figure 7:
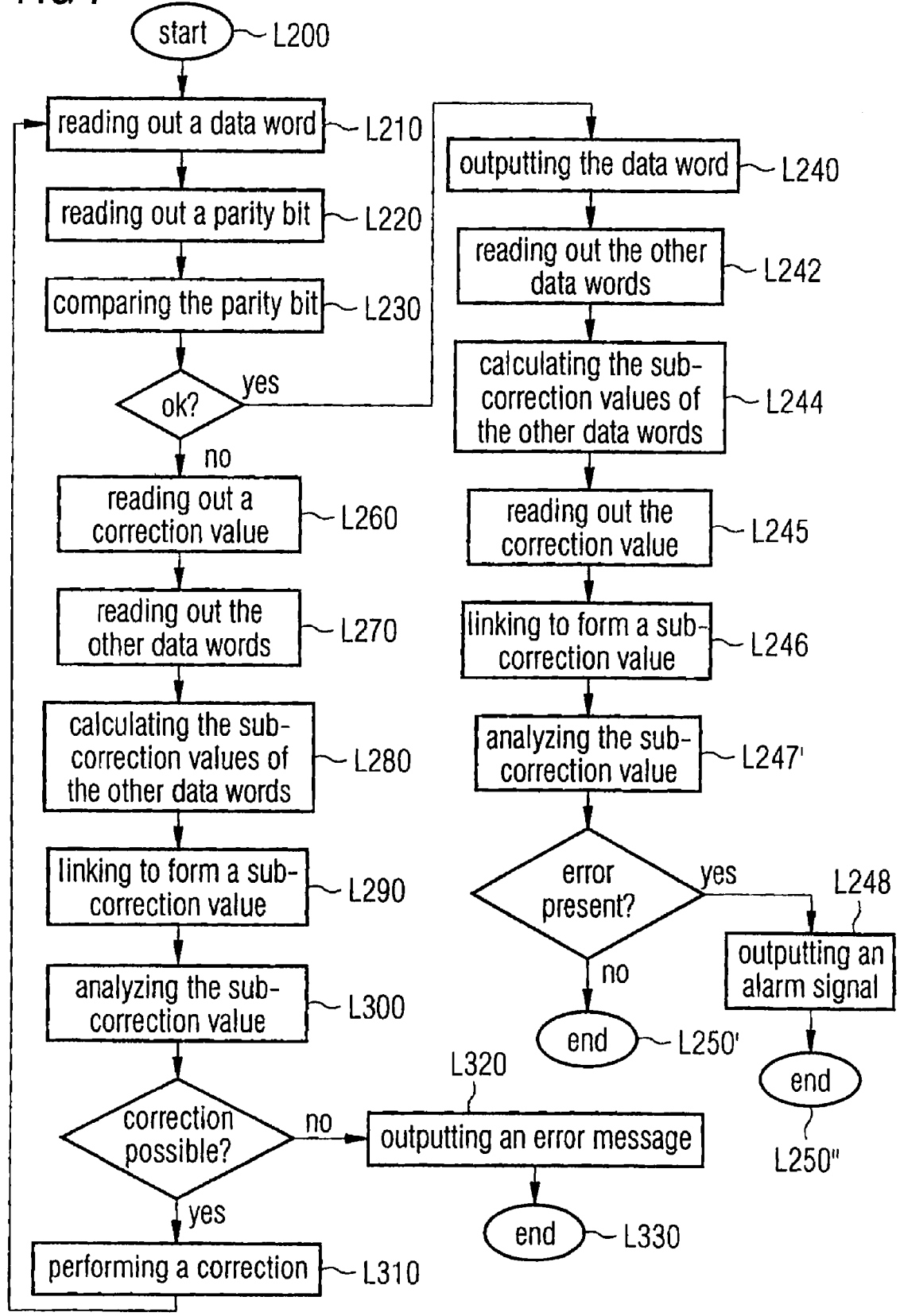
FIG. 7 is a flowchart of a fourth embodiment of the inventive method for reading out a predetermined data word from a memory.

FIG. 7 is a flowchart of a fourth embodiment of the inventive method for reading out a predetermined data word from a memory 100 which has been modified on the basis of the embodiment shown in FIG. 3 to be employed in a security application. Similarly to the embodiment shown in FIG. 6, the embodiment shown in FIG. 7 only differs from that shown in FIG. 3 in relation to the steps executed after the comparison of the parity of the data word read out and the value of the associated parity bit executed in step L230 when no difference is determined in this comparison. In this case, too, the data word will at first be output in step L240. Subsequently, the other data words are read out from the memory 100 in step L242. In step L244, the sub-correction values are calculated on the basis of the data words read out in step L242. In step L245, the correction value 140 is read out from the memory 100 and linked in a subsequent step L246, in connection with the sub-correction values calculated in step L244, to form the sub-correction value of the data word originally read out in step L210. In step L270', this sub-correction value is analyzed. If an error is determined on the basis of this analysis, an alarm signal indicating a multi-bit error will be output in step L248 and the method for reading out is finished in step L250". If, however, no error is determined in step L247', the method will be finished immediately in step L250'. Here, too, the alarm signal may be evaluated again by a security element as a sign for an attack performed and result in corresponding countermeasures, such as, for example, the security reset already mentioned, erasing sensitive data, the well-aimed destruction of individual components or other countermeasures.

In contrast to the embodiment shown in FIG. 7, a calculation of the respective sub-correction values may alternatively for example also be performed on the basis of all the data words 120-1, . . . , 120-n, the sub-correction values being linked subsequently to form an intermediate correction value which in turn is compared to the correction value 140 stored in the data block 110. On the basis of this comparison, a determination can also be made as to whether the memory 100 has been subjected to an attack so that an alarm signal has to be output in step L248, or whether there has not been an attack to the memory 100.

In addition, the embodiments shown in FIGS. 6 and 7 may also be modified in that the predetermined data word will only be output if no attack has been determined in a check for such an attack. However, the loss in the improvement in speed of the readout operation which is the very achievement of the embodiments shown in FIGS. 6 and 7, are of disadvantage of this solution. In addition, it seems suitable to extend or modify the correction value 140 stored in the data block 110 in a security application in that it is made more resistant against manipulation. Apart from encrypting the corresponding correction value 140, it is also possible to store as correction value 140 a value extended by a one-way hash function value derived from the data block 110 for an error correction code required for a possible correction. The functions and/or algorithms MD2, MD5, SHA (including sub-versions) or RIPEMD-160 are examples of one-way hash functions suitable for this.

Alternatively, after performing the correction in step L310, the predetermined data word can be corrected and output as another possible implementation of the embodiment of the inventive method for reading out a predetermined data word shown in FIGS. 3, 5, 6 and 7, without having to check again the data word stored by again passing steps L210 to L230. It is also possible to output the data word after the correction in step L310 and to only store the corrected data block 110 in the memory 100 after that.

Apart from a parity bit indicating an even or uneven parity of a data word, any other algorithm allowing an error to be identified can be used as an error identification algorithm in a parity check, i.e. when checking whether the number of the set bits of the data words is even or uneven. The usage of a parity bit in connection with a parity check is of particular advantage as it can generally be performed very quickly, i.e. within one clock of the system, and the memory space necessary for the error identification values 130-1, . . . , 130-n is minimal. Also, different error correction algorithms or correction algorithms may be employed. The Hamming code explained in the book by U. Tietze and Ch. Schenk is only one example of this.

In principle, the present invention may, of course, be applied to any memory types allowing reading and writing accesses. Apart from magnetic and optical memory media, such as, for example, hard disc drives, magnetic tapes, CD-R, CD-RW, DVD+R, DVD-R, DVD+RW, DVD-RW and other optical memory media, non-volatile memory (NVM) types, such as, for example, all flash-based products, and RAM (random access memory) types are conceivable. The present invention may be employed with particular advantage in connection with memory types which are to allow quick data access. In particular, non-volatile memories and RAM memory types, as well as cache memories, are among these memory types. Basically, the usage of the present invention in ROM (read-only memory) memory types is also conceivable even if in this case the inventive methods for storing data blocks cannot be used or hardly used during operation, but only when programming and/or manufacturing same.

Depending on the circumstances, the inventive method for reading out a predetermined data word and the inventive method for storing a data block in a memory may be implemented in either hardware or software. The implementation may be on a digital storage medium, in particular on a disc, CD or DVD having control signals which may be read out electronically which can cooperate with a programmable computer system such that the inventive method for reading out a predetermined data word from a memory or the inventive method for storing a data block in a memory will be executed. Generally, the invention thus also is in a computer program product having a program code stored on a machine-readable carrier for performing one of the inventive methods when the computer program product runs on a computer. Put differently, the invention thus may also be realized as a computer program having a program code for performing one of the methods when the computer program runs on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A device for reading out a predetermined data word from a memory in which a data block is divided into a plurality of data words including the predetermined data word, an error identification value associated with the respective data word per data word of the plurality of data words, and a correction value associated with the data block are stored, comprising:
   an error identifier implemented to check whether the predetermined data word comprises a predetermined relation to the associated error identification value to conclude that there is an error if the predetermined relation is not present; and
   an error corrector implemented to correct the error using the correction value if the predetermined data word does not comprise the predetermined relation to the associated error identification value,
   wherein the error corrector is implemented to use the correction value for error correction independent of which data word of the plurality of data words is the predetermined data word.

2. The device according to claim 1, wherein the error corrector is implemented to use the correction value as a whole to correct the error independent of which data word of the plurality of data words is the predetermined data word.

3. The device according to claim 1, wherein the error identification values associated with the respective data word each comprise a length of precisely one bit.

4. The device according to claim 1, wherein the error identification values associated with the respective data words are parity bits, and wherein the error identifier is implemented such that the predetermined relation is that the parity of the respective data word and the value of the associated parity bit comprise a predetermined second relation to each other.

5. The device according to claim 1, wherein the error corrector is implemented to correct any one-bit error in the data block based on the correction value.

6. The device according to claim 1, wherein the error corrector is implemented to correct any one-bit error in the predetermined data word or in the predetermined data word and the associated error identification value.

7. The device according to claim 6, wherein the error corrector is implemented to, in the case that the predetermined data word does not comprise the predetermined relation to the associated error identification value, calculate a sub-correction value based on each data word from the plurality of data words which is not the predetermined data word, link the sub-correction values to obtain an intermediate correction value, determine a reconstructed sub-correction value for the predetermined data word based on the intermediate correction value and the correction value, and correct the predetermined data word and the associated error identification value based on the reconstructed sub-correction value.

8. The device according to claim 7, wherein the error corrector is implemented to perform, when calculating the sub-correction values, the calculation at first based on the data words and the associated error identification values to obtain the sub-correction value.

9. The device according to claim 7, wherein the error corrector is implemented to link, when linking the sub-correction values to form the intermediate correction value and/or when determining the reconstructed sub-correction value based on the intermediate correction value and the correction value, the sub-correction values bit by bit by an XOR operation.

10. The device according to claim 1, wherein the correction value comprises a minimum length sufficient to correct a one-bit error.

11. The device according to claim 1, wherein the error identifier is further implemented to check, if the predetermined data word comprises the predetermined relation to the associated error identification value, the data block or the predetermined data word with/without the associated error identification value for an unidentified error using the correction value and, if there is an unidentified error, to output an alarm signal.

12. A method for reading out a predetermined data word from a memory in which a data block is divided into a plurality of data words including the predetermined data word, an error identification value associated with the respective data word per data word of the plurality of data words, and a correction value associated with the data block are stored, comprising:
   checking, by an error identifier, whether the predetermined data word comprises a predetermined relation to the associated error identification value to conclude that there is an error if the predetermined relation is not present; and
   correcting, by an error corrector, the error using the correction value if the predetermined data word does not comprise the predetermined relation to the associated error identification value,
   wherein, in the step of correcting, the correction value is used for error correction independent of which data word of the plurality of data words is the predetermined data word.

13. A device for reading out a predetermined data word from a memory in which a data block is divided into a plurality of data words including the predetermined data word, an error identification value associated with the respective data word, which, however, does not allow a correction of the respective data word, per data word of the plurality of data words, and a correction value associated with the data block are stored, comprising:
   an error identifier implemented to check whether the predetermined data word comprises a predetermined relation to the associated error identification value to conclude that there is an error if the predetermined relation is not present; and
   an error corrector implemented to correct, if the predetermined data word does not comprise the predetermined relation to the associated error identification value, the error using the correction value, wherein the error corrector is implemented to use the correction value for error correction independent of which data word of the plurality of data words is the predetermined data word.

14. A method for reading out a predetermined data word from a memory in which a data block is divided into a plurality of data words including the predetermined data word, an error identification value associated with the respective data word, which, however, does not allow the respective data word to be corrected, per data word of the plurality of data words, and a correction value associated with the data block are stored, comprising:
  checking, by an error identifier, whether the predetermined data word comprises a predetermined relation to the associated error identification value to conclude that there is an error if the predetermined relation is not present; and
  correcting, by an error corrector, the error using the correction value if the predetermined data word does not comprise the predetermined relation to the associated error identification value,
  wherein in the step of correcting the correction value is used for error correction independent of which data word of the plurality of data words is the predetermined data word.

15. A non-transitory computer-readable storage medium having stored thereon a computer program comprising a program code for performing a method for reading out a predetermined data word from a memory in which a data block is divided into a plurality of data words including the predetermined data word, an error identification value associated with the respective data word per data word of the plurality of data words, and a correction value associated with the data block are stored, comprising: checking whether the predetermined data word comprises a predetermined relation to the associated error identification value to conclude that there is an error if the predetermined relation is not present; and correcting the error using the correction value if the predetermined data word does not comprise the predetermined relation to the associated error identification value, wherein, in the step of correcting, the correction value is used for error correction independent of which data word of the plurality of data words is the predetermined data word, when the computer program runs on a computer.

16. A non-transitory computer-readable storage medium having stored thereon a computer program comprising a program code for performing a method for reading out a predetermined data word from a memory in which a data block is divided into a plurality of data words including the predetermined data word, an error identification value associated with the respective data word, which, however, does not allow the respective data word to be corrected, per data word of the plurality of data words, and a correction value associated with the data block are stored, comprising: checking whether the predetermined data word comprises a predetermined relation to the associated error identification value to conclude that there is an error if the predetermined relation is not present; and correcting the error using the correction value if the predetermined data word does not comprise the predetermined relation to the associated error identification value, wherein in the step of correcting the correction value is used for error correction independent of which data word of the plurality of data words is the predetermined data word, when the computer program runs on a computer.

* * * * *